US008207482B2

(12) United States Patent
Rosa

(10) Patent No.: US 8,207,482 B2
(45) Date of Patent: Jun. 26, 2012

(54) NON-IMAGING DIFFUSE LIGHT CONCENTRATOR

(75) Inventor: James Rosa, Woodstock, NY (US)

(73) Assignee: James Rosa, Woodstock, NY (US)

( * ) Notice: Subject to any disclaimer, the term of this patent is extended or adjusted under 35 U.S.C. 154(b) by 402 days.

(21) Appl. No.: 12/451,930

(22) PCT Filed: Jun. 23, 2008

(86) PCT No.: PCT/US2008/007809
§ 371 (c)(1),
(2), (4) Date: Dec. 8, 2009

(87) PCT Pub. No.: WO2009/005621
PCT Pub. Date: Jan. 8, 2009

(65) Prior Publication Data
US 2010/0132753 A1    Jun. 3, 2010

(51) Int. Cl.
*H01L 31/0232* (2006.01)
(52) U.S. Cl. .................. 250/203.4; 136/246
(58) Field of Classification Search .......... 250/203.4, 250/216; 136/200, 246; 359/832, 837
See application file for complete search history.

(56) References Cited

U.S. PATENT DOCUMENTS
6,294,723 B2 *  9/2001  Uematsu et al. ............. 136/246
* cited by examiner

*Primary Examiner* — Seung C Sohn

(57) ABSTRACT

A radiant energy trap. This diffuse and direct radiant energy concentrator comprises at least one reflector, a refractor substantially prism shaped and a receiver interfaced with the refractor. The invention is capable of a solid angle of acceptance of radiant energy, equivalent to that of a flat panel collector, while maintaining a relatively high concentration ratio of diffuse light. The invention can be embodied as an effective hybrid solar electric and thermal collector. A unique yet simple geometry results in relatively high optical and thermal efficiency. The invention can be embodied as a low profile 3-D diffuse light concentrator, combining reflection, refraction, and total internal reflection to approach the thermodynamic limit. It minimizes materials cost to the limits of cost reduction with relatively high efficiency PV cells. The invention increases the utilization of available solar energy and greatly reduces installed system payback periods, compared to prior art.

23 Claims, 12 Drawing Sheets

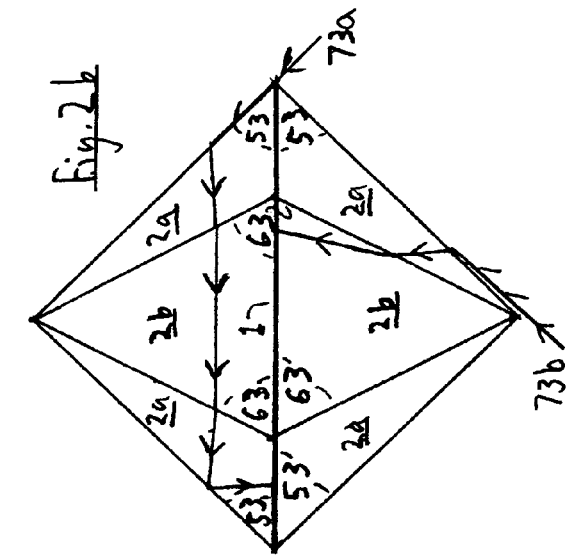
Fig. 2
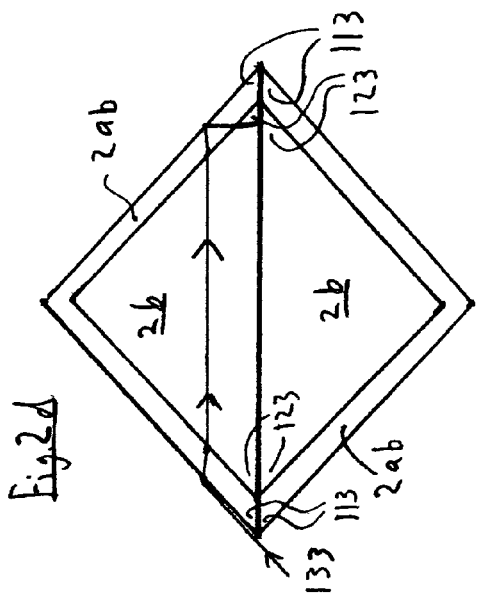
Fig. 2b
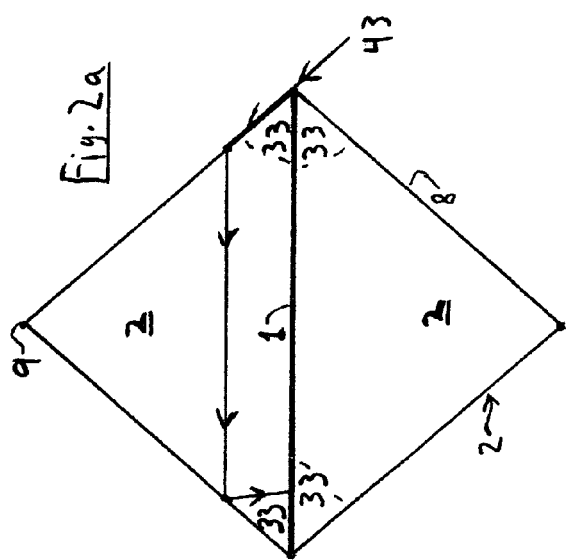
Fig. 2a
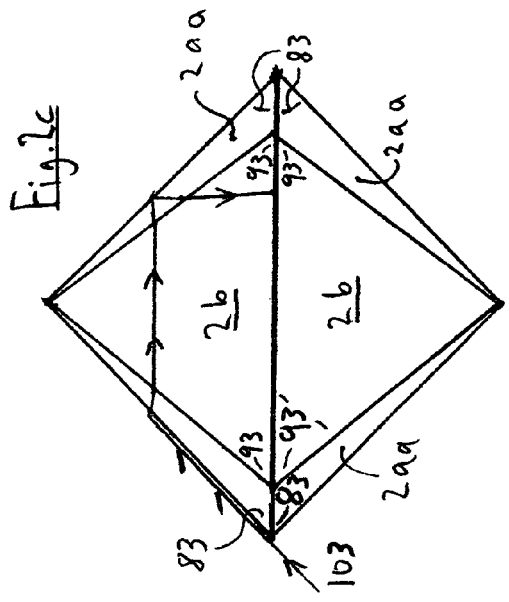
Fig. 2c
Fig. 2d

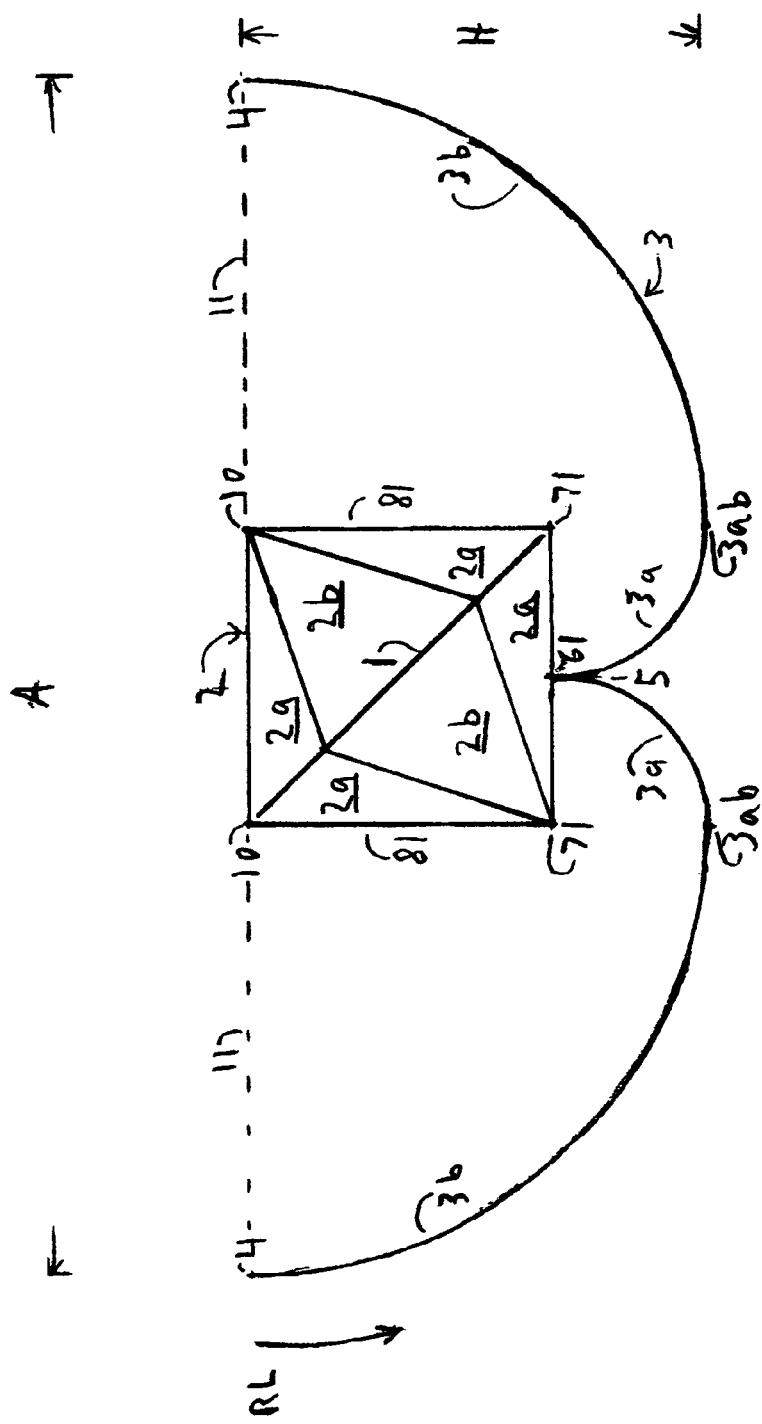

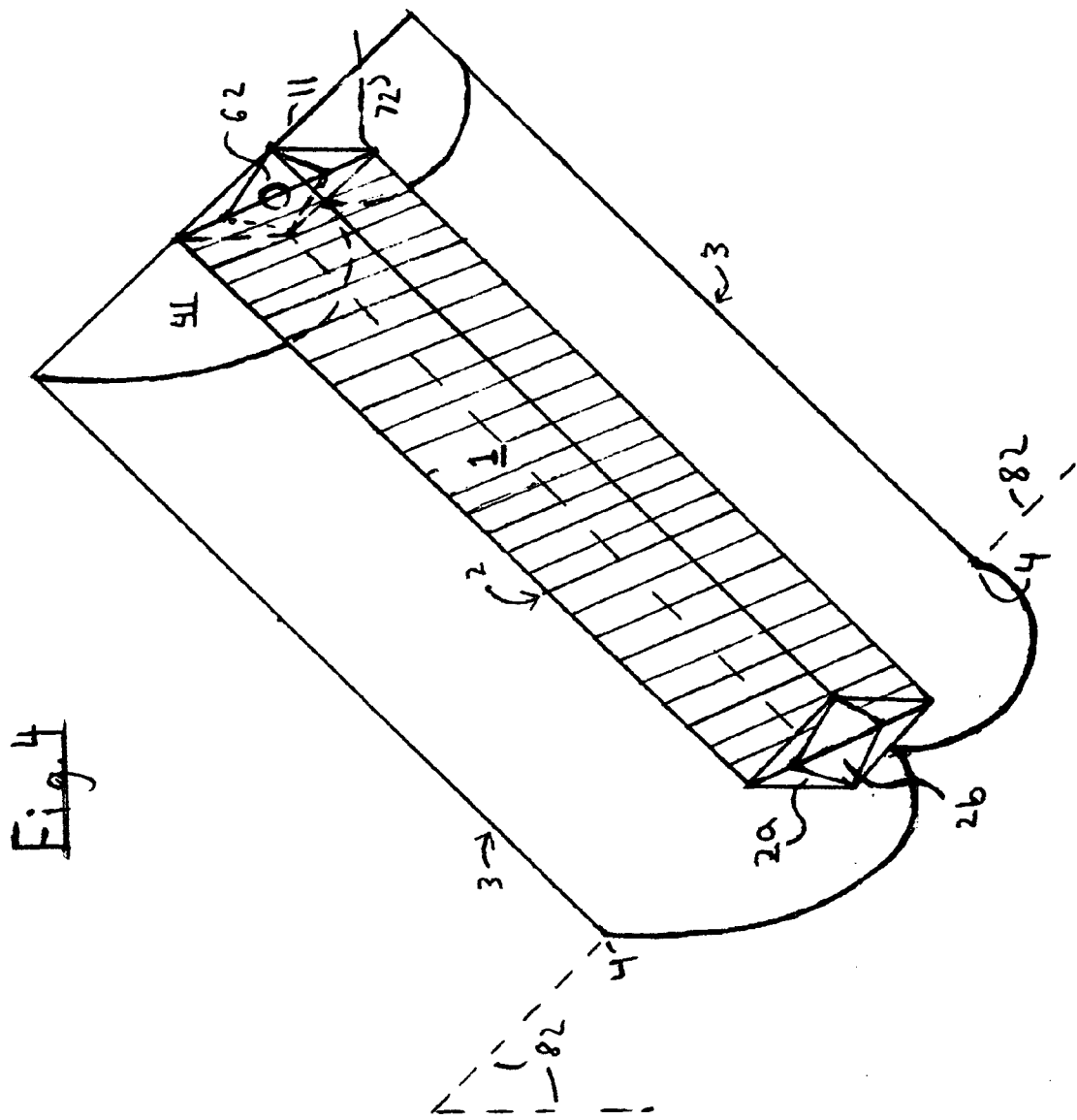

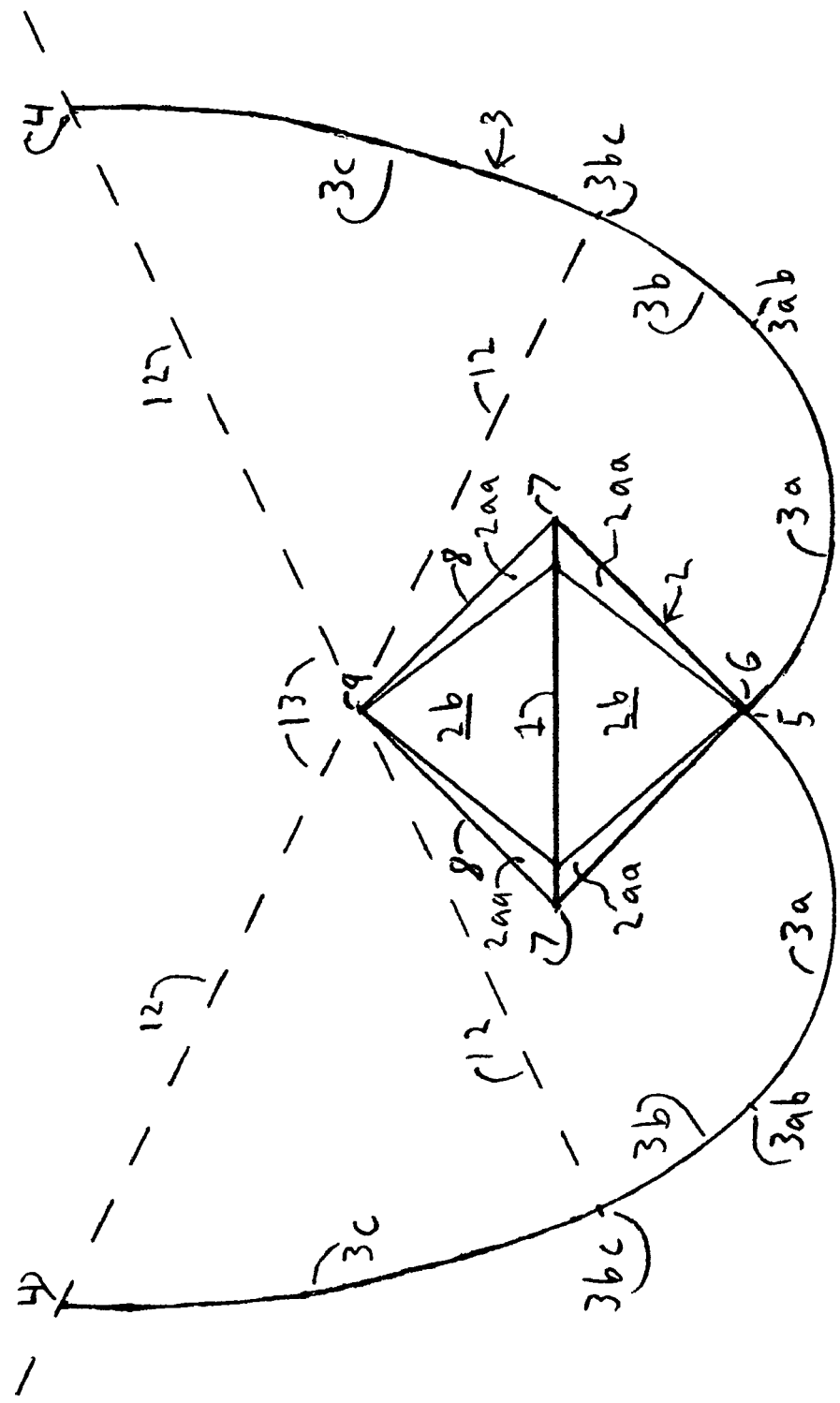

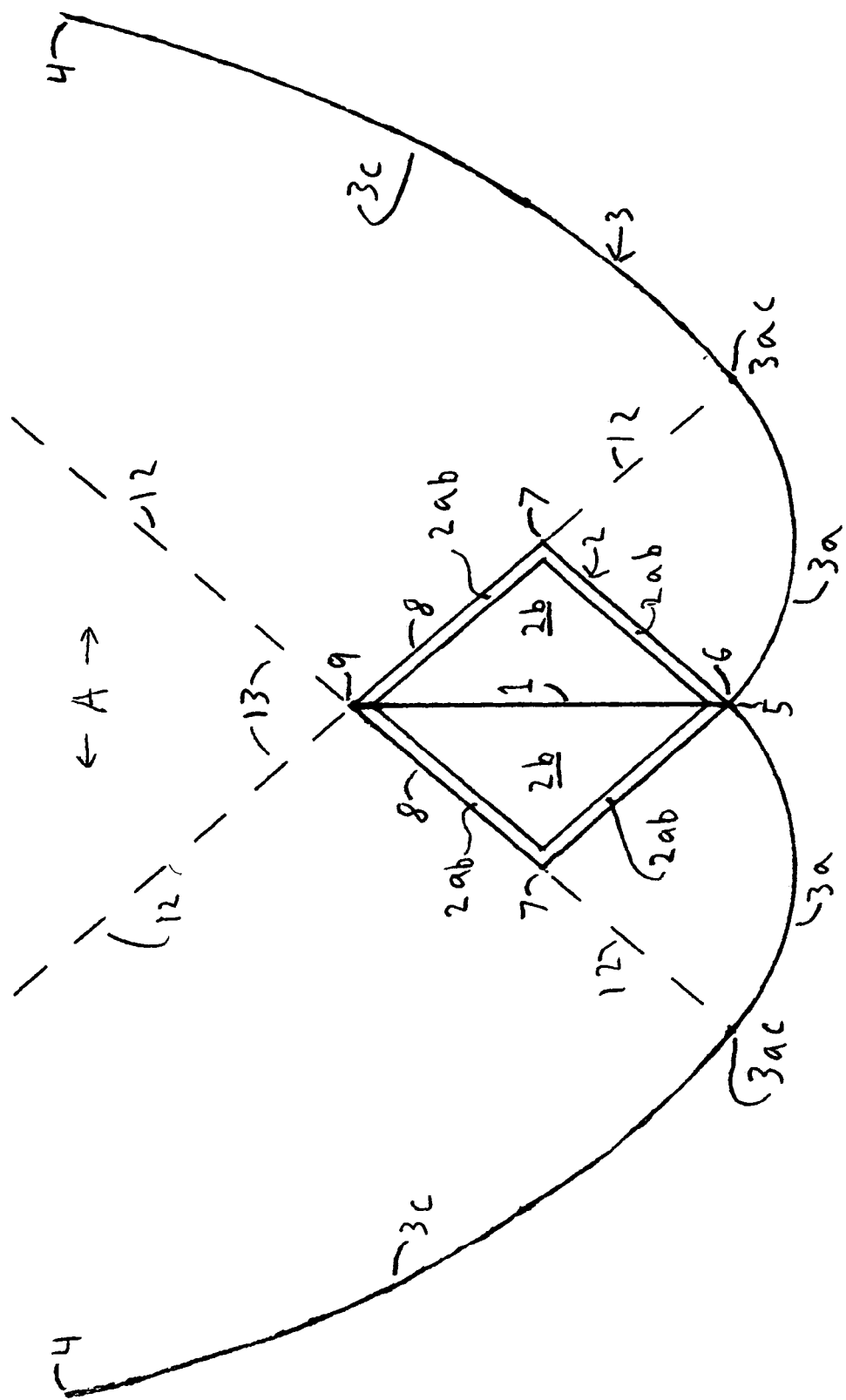

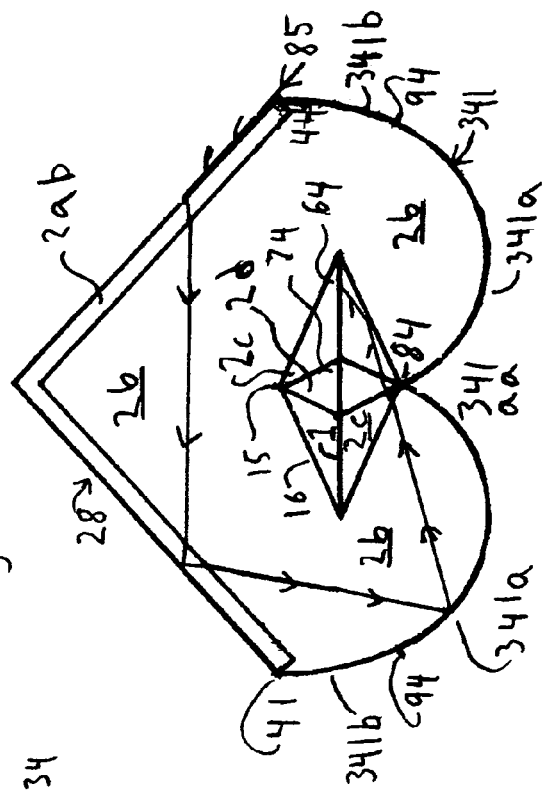
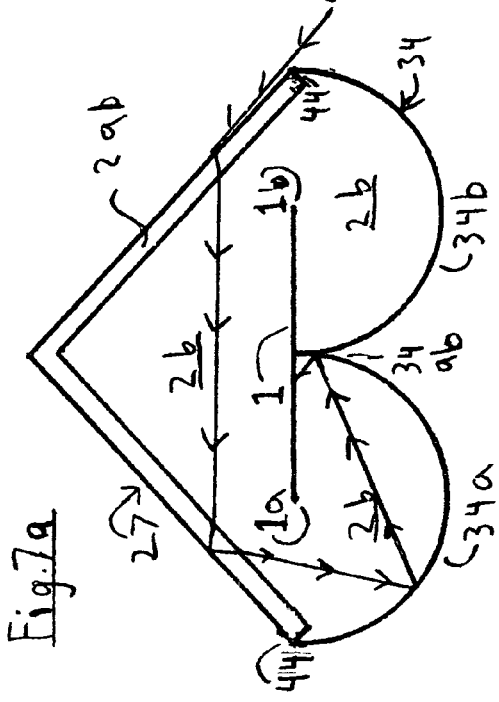
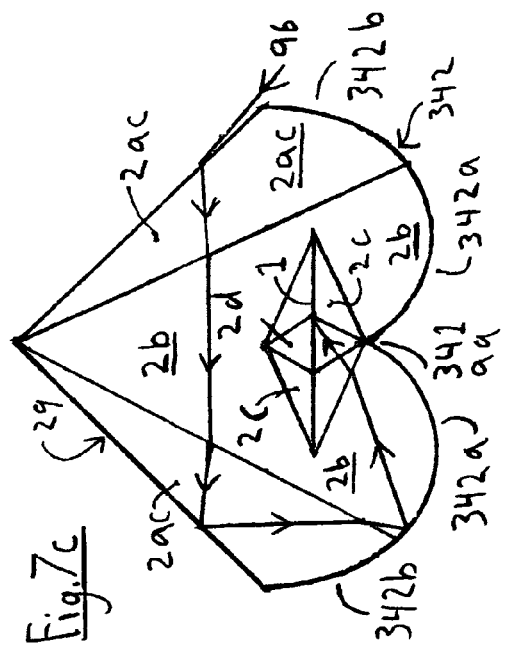
Fig.7a,b,c
Fig.7b
Fig.7a
Fig.7c

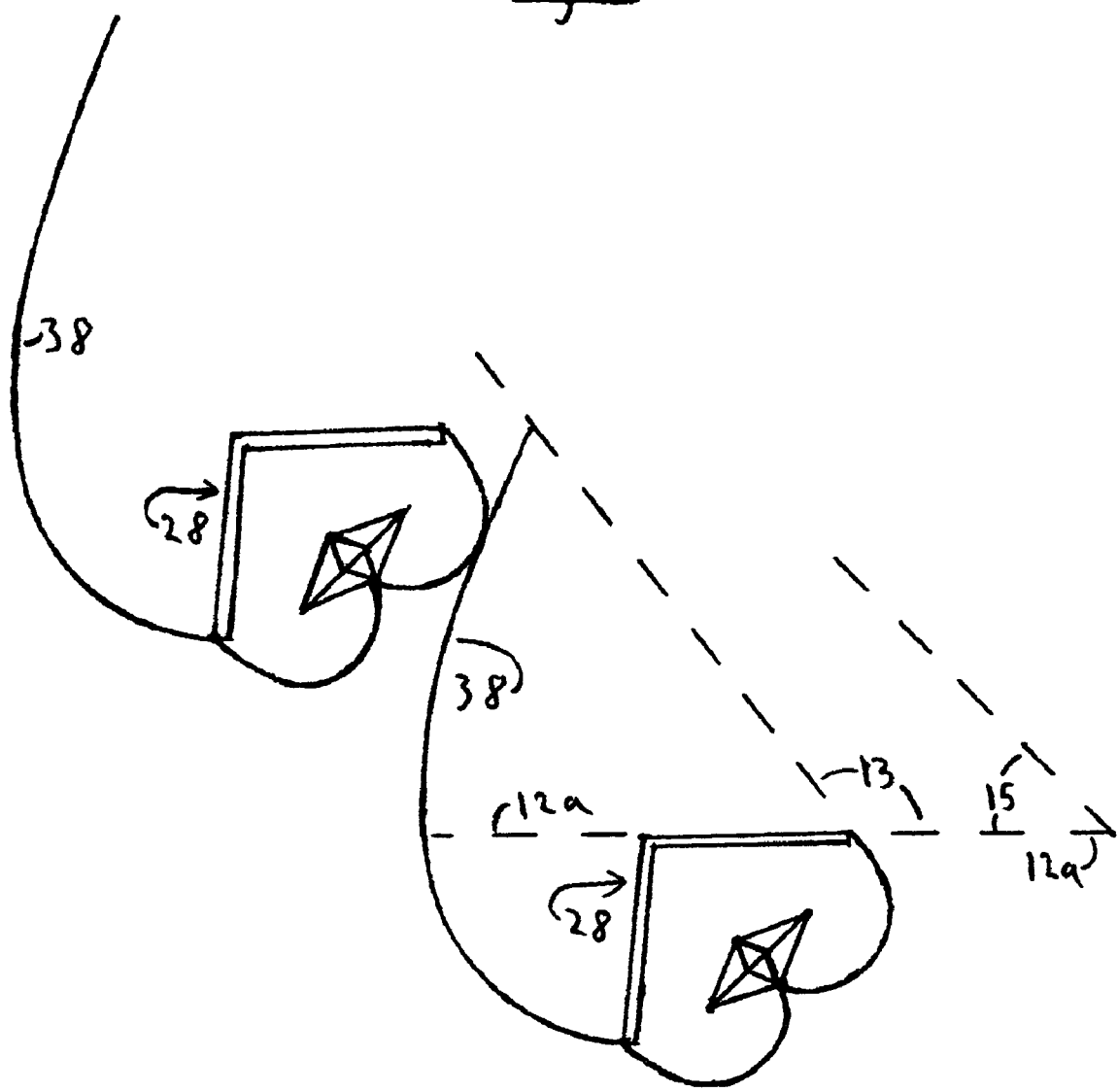

NON-IMAGING DIFFUSE LIGHT CONCENTRATOR

TECHNICAL FIELD

The invention is a radiant energy trap. It relates to the field of solar energy and more particularly to combined electric and thermal conversion and diffuse light concentrating solar collectors.

BACKGROUND ART

Problems associated with the use of fossil fuels, such as global warming, environmental degradation, rising energy costs, peak oil, and global conflicts, have created a need for a solar based economy. Cost competitive solar energy production will probably be required before this goal can be reached. Flat panel solar electric (PV cell) collectors are relatively expensive. Attempts to economize solar energy include concentrating parabolic reflectors that only work in direct sunlight. Even haze or smog reduce the direct sunlight collected. Significant costs are incurred for critical reflector shape, support structure, sun tracking capability, and transmission loss to less sunny regions. Flat panel PV cell collectors are simple to construct, can be stationary and hemi-spherically collect ambient radiant energy, however they operates less efficiently with diffuse only light.

Attempts to combine the best of flat panels, and parabolic concentrators include compound parabolic concentrators (CPC). CPCs use reflectors to concentrate (CR) and collect ambient light over a limited angle of acceptance (AOA) according to the ideal 2-D relationship, CR=1/sin(half AOA). CPC reflector's are usually truncated in height, with a reduced CR and collect some light outside the AOA. CPC variants sometimes use transparent refractors. These types of collectors are more generally called radiant energy traps. Designs include those by Eshelman, Knowles, Winston, Gill, Vasylyev, Isofoton S.A., and Sci Tech U.S.A., and European patents EP0070747 and DE 3233081. Refractors are used in designs by Kapany, Johnson, Winston, Lee, Chemey, Fereidooni, Chen and in Bowden's designs, from the University of New South Wales. The main problem with prior art is that they suffer from a relatively small AOA, or too low a diffuse light CR-AOA combination. The material and manufacturing costs are usually too high for the relative size of the aperture (A) to the refractor size, or reflector area, described as the length of the reflector curve (RL) or height (H), as the ratios; RL/A and WA respectively. 3-D concentrators, such as those in Steigerwald's patent #DE10059555 A1, Puall's patent application #20050081909, Lichy's patent application #20060072222, Bowden's thesis, Murtha's U.S. Pat. Nos. 6,021,007 and 6,619,282 also suffer from low CR for the AOA or unreasonably high optics costs, compared to the current invention.

Additional problems with solar power need to be addressed. Installed system payback periods are too long to be generally accepted. In seasonal climates, providing most of a buildings thermal and electrical needs would require an unreasonably large un-shaded solar collector area. PV cell efficiency drops in the hot sun. Even cooled cells waste about 80% of the radiant energy striking them. A hybrid collector combines electric and thermal functions. Numerous hybrid systems have been attempted, as in Mlausky and Winston's U.S. Pat. No. 4,045,246, Damsker's U.S. Pat. No. 4,395,582, Goldman's U.S. Pat. No. 4,427,838, the "CHAPS" project at Australian National University, CPC designs, by Brogren at Uppsala University in Sweden, Puall's patent application #20050081909, Johnson's U.S. Pat. No. 6,080,927 or Nicoletti's U.S. Pat. No. 7,173,179. These designs have small AOA for the CR, poor energy utilization, require sun tracking or are cost prohibitive relative to the current invention.

DISCLOSURE OF INVENTION

This invention is radiant energy trap. It comprises a refractor that is positioned to be incident with radiant energy reflected off at least one reflector. The refractor is shaped and positioned to direct radiant energy to a receiver. The refractor substantially comprises a prism shape. The receiver is interfaced with the refractor. The invention is a diffuse and direct radiant energy concentrator that can have of a solid angle of acceptance (AOA) of ambient radiant energy, equivalent to that of a flat panel solar collector. The AOA is achieved while maintaining a relatively high concentration ratio (CR) of diffuse light that significantly reduces the size of the receiver. The refractor can employ combinations of different refractive index materials (I-of-R) and take advantage of total internal reflection (TIR). The refractor can be solid or a composite of nested layers. Refractive layers can increase concentration ratio and reduce thermal losses. Inner fluid refractive layers can be thermal transfer fluid, flowing through the invention. The refractor can be symmetrical or asymmetrical, have transparent and some reflective surfaces. The receiver can have functions such as a thermal receiver, a detector or transducer. The receiver can have flat opposing faces to support the use of bi-facial photoelectric (PV) cells. The reflector(s) can be simple or a composite of different curvatures that are symmetrical or asymmetrical. The simple collector geometry permits high optical and thermal efficiency. The invention can have a relatively low profile, low RL/A, and be a higher CR 3-D concentrator, without lowering AOA or collector array packing density. Installed system payback period is reduced to a minimum. The different embodiments allow for cost effective optimization. The invention can replace stationary flat panel solar collectors, some parabolic concentrators, or be a secondary concentrator to multiply a primary CR or to simplify tracking requirements.

BRIEF DESCRIPTION OF DRAWINGS

FIGS. 2a to d are cross-sectional views of symmetrical embodiments of the refractor.

FIG. 3 is a cross-sectional view of an embodiment of the invention.

FIG. 4 is a perspective view of FIG. 3

FIG. 5 is a cross-sectional view of an embodiment of the invention.

FIG. 6 is a cross-sectional view of an embodiment of the invention using the refractor of FIG. 2d.

FIGS. 7a, b and c are cross-sectional views of asymmetrical embodiments of the refractor.

FIG. 12 is a view of two of the cross-sectional view of FIG. 8.

BEST MODES FOR CARRYING OUT THE INVENTION

Figure 1:
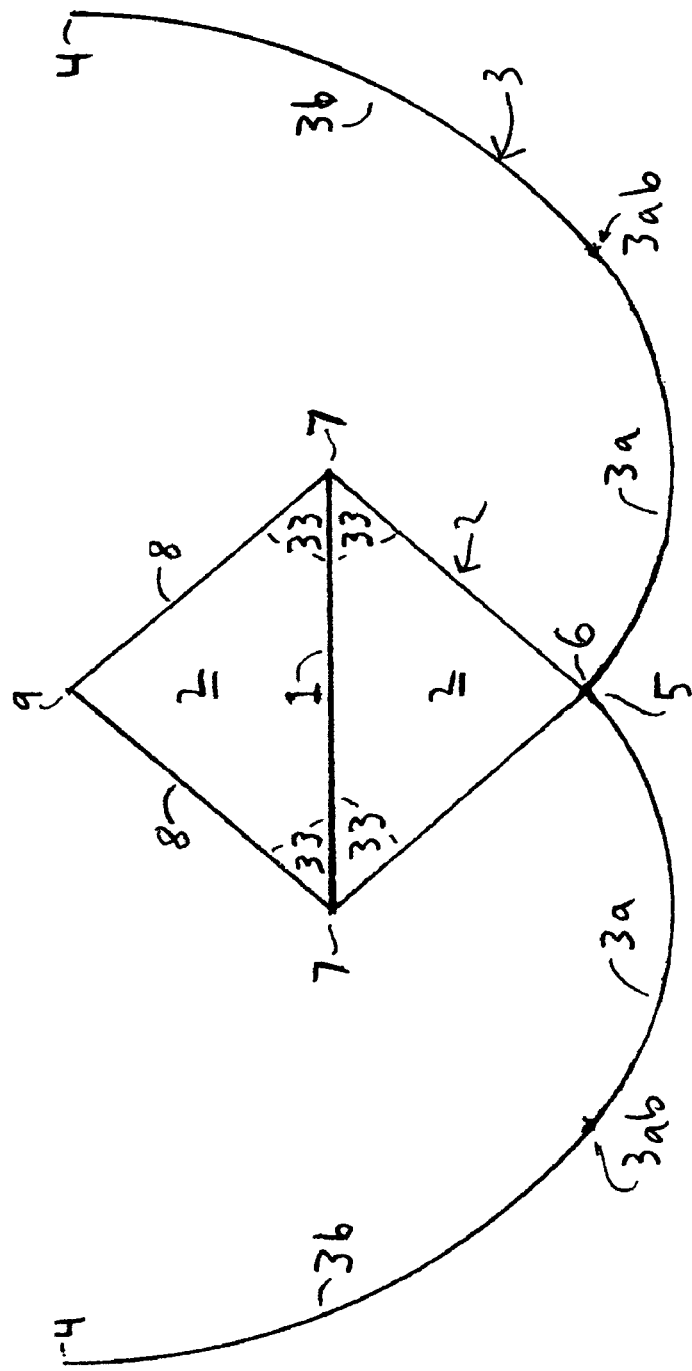
FIG. 1 is a cross-sectional view of an embodiment of the invention.

This invention is a radiant energy trap. It comprises a refractor that is positioned to be incident with radiant energy reflected off at least one reflector. The refractor is shaped and positioned to direct radiant energy to a receiver. The refractor substantially comprises a prism shape. The receiver is interfaced with the refractor. The reflector(s) can be made of materials such as front silvered or aluminized metal sheet, or rear silvered or aluminized acrylic or sun rated clear plastic, formed by suitable methods. The refractor can have a single index of refraction (I-of-R) or be a composite of I-of-R mediums, such as glass, acrylic or interior fluid mediums. Two nominal I-of-R values, n ( )=, are used in the drawings. The drawings include symmetrical and asymmetrical embodiments that conserve phase-space and with reflector shaping known to those versed in the art. In the drawings the receiver is bifacial and within the refractor, as one piece or in sections. The receiver is such as; a selectively coated plate, detector, transducer, or bi-facial PV cells. A bi-facial receiver is shown in the drawings. The PV cells can be in thermal contact with a heat transfer fluid pumped through the collector, to form a hybrid solar collector. Refractive fluid sections are such as; water, salted water, a freeze protected fluid. Refractor layers can enhance thermal isolation, alter absorption/reflection characteristics and enhance light trapping and concentration. The reflector and transparent refractor components can be formed and secured by conventional means and be mutually supportive or use scale appropriate supporting members. Collector components can include; a transparent cover plate, end caps, framing, plumbing, electrical connections, suitable thermal isolation and ancillary elements.

FIG. 1 is a transverse cross-sectional view of an embodiment of the invention. The receiver 1 is seen on edge, as a diagonal within a solid, transparent, "diamond" shaped and oriented symmetrically sided refractor 2. The refractor 2 is nested within the curvatures of the symmetrical adjacent reflector 3. Each symmetrical half of the reflector 3 consists of two contiguous circular arc sections 3a and 3b comprising an inner smaller radius section 3a and outer larger radius section 3b. The reflector has ends at corresponding points 4 that create an overall half-round curve. In FIG. 1 the smaller radius circular curvature, reflector sections 3a start at a centerline edge point 5 at the bottom center 6 of the refractor 2. The refractor's bottom center 6 has corresponding nearest side corners 7, each of which is a focus for the corresponding radius of each smaller circular curvature reflector section 3a. The smaller circular curvature reflector section 3a ends at a change in curvature point 3ab, which is in line with the corresponding upper side 8 of the refractor 2. The top point 9 of the refractor 2 is the focus for the corresponding larger radius circular curvature reflector section 3b that starts at a curvature change point 3ab. The corresponding ends 4 of the larger radius reflector sections 3b are in line with the top point 9 of the refractor. The solid refractor 2 can be seen as a pair of contiguous opposing triangular prisms 2 with the receiver 1 as the base and two corresponding sides 8 as a triangular half of the refractor 2. The base and each side forms a side to base angle (SBA) 33.

FIG. 2a to d are transverse cross-sectional views of several symmetrical embodiments of the refractor. The refractor embodiment from FIG. 1 is in FIG. 2a. In FIG. 2a, a critical side to base angle (SBA) 33 allows for TIR, as indicated by a representation of an edge ray of light 43, shown entering the refractor 2 and striking the receiver 1. FIG. 2b is a composite refractor, with a transparent outer solid refractor section 2a and an interior, symmetrical diamond shaped transparent, lower I-of-R, refractor section 2b. The interior refractor section 2b has interior side to base angles (ISBA) 63. TIR for given I-of-Rs requires a pair of angles; a not more than SBA and a not less than ISBA. A larger ISBA than a critical minimum angle would not minimize the refractors' outer solid refractor area 2a. In FIG. 2b the SBA 53 subtends a critical maximum for TIR, for a given ISBA 63 minimum. In FIG. 2b each refractor section 2a and 2b has the same cross-sectional area. A representation of an edge ray of light 73a is shown entering the refractor section 2a, being refracted and eventually striking the receiver 1. A second ray 73b shows another refractive path to the receiver 1.

In FIG. 2c the SBA 83 of the symmetrical refractor is reduced to about 43° with a corresponding critical ISBA 93 of about 50°, which results proportionally in about 20% outer solid material 2aa, such as glass or acrylic and 80% inner refractive medium 2b, such as water, to maintain TIR, and minimize glass or acrylic use for the selected SBA 83, as indicated by the edge ray 103.

In FIG. 2d the outer refractor 2ab encloses the inner fluid refractor section 2b. All SBAs 113 and ISBAs 123 subtend the same size angle, about 41.4°. This is the maximum angle size for parallel surfaces of nominal n=1.5 material, such as panes of glass or acrylic sheet, enclosing a nominal n=1.33 fluid, such as water, to maintain TIR, as indicated by the edge ray 133. The "panes of glass" of the outer refractor 2ab, with glass of reasonable thickness, would have a similar 20% to 80% cross-sectional proportion as in FIG. 2c, and probably cost less than wedges of glass.

FIG. 3 is a transverse cross-sectional view of an embodiment of the invention using the refractor of FIG. 2b with a "square" orientation. The receiver 1 is seen on edge as a diagonal of the transparent, square perimeter, refractor 2. The refractor 2 is symmetrically nested within an, overall, half-round symmetrical adjacent reflector 3. Each symmetrical half of the reflector 3 consists of two contiguous circular arc sections of smaller 3a and larger 3b radius. Radius changes take place at change in curvature points 3ab. In FIG. 3, corresponding smaller radius circular curvature sections 3a of the adjacent reflector 3 start at a centerline edge 5 at the bottom center 61 of the refractor 2. The corresponding bottom corner 71 of the refractor 2 is the focus of the smaller radius, circular curvature section 3a. The curvature of the reflector changes from a smaller to larger radius at a change in curvature point 3ab, which is in line with the corresponding side 81 of the refractor 2. The focus for the corresponding larger radius circular curvature reflector section 3b is the corresponding top corner 10 of the refractor 2. Corresponding ends 4 of the larger radius, circular curvature reflectors 3b, form a diameter 11 as a virtual line with top corners 10 of the refractor 2.

FIG. 4 is a perspective view of FIG. 3 as a longitudinal trough-like collector, with the diagonally positioned receiver 1, within the transparent composite refractor 2a and b, which is adjacent to the reflector 3. A transverse planar reflective end cap 41 terminates the reflector 3 and refractor 2. The reflector diameter 11 corresponds to the top edge of the reflective end cap 41. A refractor fluid port 62 exits through the reflective end cap 41. Electrical wiring 72, from a receiver composed of bi-facial PV cells, can emerge through a hole in the planar reflector end cap 41 at a desired location. The dotted lines 82 extending from the top ends 4 of the reflector 3 indicate the plane of the transverse cross-section of FIG. 3. The top edge lines 4 and 11, as a perimeter of the adjacent reflector 3 and reflective end caps 41 respectively, outlines the aperture of the embodiment.

This embodiment has a transverse 180-degree by, a longitudinal 180-degree AOA, with a CR of about three. The height H aperture A ratio, H/A, is about 0.38, and a reflector curvature length RL to A, ratio, RDA, is about 1.5. The optical efficiency can be up to about 0.95. A classic CPC, similar to U.S. Pat. No. 4,002,499 by Winston and U.S. Pat. No. 4,561,424 by Gill, with a 50% truncated reflector, having a CR of about 2.7, has an AOA of only about 38°. They have an H/A ratio of more than double FIG. 3, a RL/A ratio of about 2.5 (more reflector), and they require a critical reflector alignment. A more direct 11/A, RL/A comparison is from U.S. Pat. Nos. 5,971,551 and 6,244,264 by Winston, which only has an AOA of 55° and CR of 1.45, less than half FIG. 3's. Based on aperture size U.S. Pat. No. 5,699,201 by Lee, U.S. Pat. No. 6,700,054, by Cherney and U.S. Pat. No. 6,700,054 by Fereidooni are relatively massive, single, spherical or flat surface, truncated V-trough refractors with relatively small AOA-CR combinations. Light crosses multiple refractive boundaries in Fereidooni's U.S. Pat. No. 6,700,054, lowering optical efficiency.

FIG. 5 is a cross-sectional view of an embodiment of the invention with the refractor of FIG. 2c nested in a reflector 3. Each symmetrical half of the adjacent reflector 3 has three contiguous sections composed of an inner most, smaller radius circular curvature section 3a, a second larger radius circular curvature section 3b and a third, parabolic curvature section 3c. The smaller radius circular curvature reflector sections 3a start at a centerline 5 at the bottom 6 of the refractor 2. The corresponding side corner 7 of the refractor 2, composed of outer refractive area 2aa and inner refractive area 2b, is the focus for a smaller radius circular curvature reflector section 3a. The smaller radius circular curvature reflector section 3a ends at a change in curvature point 3ab, which is in line with the corresponding upper side 8 of the refractor 2. The refractor top point 9 is the focus for the corresponding larger radius circular curvature reflector section 3b. The corresponding larger radius circular curvature reflector section ends at a second change in curvature point 3bc, which is in line with the virtual sides 12 of the transverse AOA 13. The virtual sides 12 cross at the refractor top 9, which is the focus for the corresponding parabolic curvature reflector section 3c. The virtual sides 12 extend to intersect corresponding ends 4 of the respective parabolic curvature reflector sections 3c. A smaller 130° AOA 13 results in a higher CR.

FIG. 6 is a cross-sectional view of an embodiment of the invention. The reflector 3 has a transverse 83° AOA 13. The refractor 2 is from FIG. 2d and is nested within the symmetrical reflector 3. The receiver 1 is vertical and in line with the reflector centerline edge 5, which junctions with the refractor bottom 6. The transparent refractor 2 is composed of an outer solid section 2ab, and an inner fluid section 2b that is about 80% of the refractor's 2 cross-section. The transverse AOA 13 subtends the angle of adjacent sides 8 of the refractor 2 that are bisected by the receiver 1. The adjacent reflector 3 is composed of a symmetrical pair of inner circular curvature sections 3a, with the corresponding refractor side corner 7 as the focus, and an outer correspondingly contiguous pair of symmetrical parabolic curvature sections 3c, with the refractor top 9 as the focus. The corresponding change in curvature point 3ac is intersected by the respective virtual line or side 12 of the transverse AOA 13. The symmetrical parabolic curvature reflector sections 3c are not full parabolas, but are truncated parabolas. The symmetrical reflector ends 4 delineate the cross-sectional aperture A. The CR of about 3.75. Additional diffuse light is collected by the reflectors truncation which is a transverse "view" of about 140°.

FIGS. 7a, b and c are transverse views of asymmetrical embodiments of the refractor. FIGS. 7a and b are asymmetrical embodiments of the refractor in FIG. 2d. In FIGS. 7a and 7b the solid transparent "panes of glass" refractor section 2ab is effectively continuous, with a respective secondary, overall, half round concave specular reflector 34 or 341, at the solid refractor's corresponding ends 44. The outer solid transparent refractor section 2ab and secondary reflector section 34 or 341, enclose the inner transparent fluid refractor section 2b.

In FIG. 7a, the effectively continuous secondary reflector 34 is composed of a symmetrical pair of half round reflector sections 34a and 34b with a centerline edge point 34ab. The receiver 1 is centered along the line of the refractor ends 44. Corresponding receiver ends 1a and 1b of the receiver 1 are the respective focus for each half-circular curvature reflector section 34a and b. An edge ray 54 is shown entering the refractor 27 and terminating at the receiver 1.

FIG. 7b is similar to FIG. 7a, but with transparent, symmetrical, diamond shaped secondary composite refractor sections 2c and 2d. The primary fluid refractor section 2b surrounds the secondary solid refractor section 2c, which in turn encloses the secondary fluid refractor section 2d. The secondary solid refractor section 2c encloses the receiver 1. The secondary refractor top apex 15 is in line with the secondary reflector ends 44. Each half of the symmetrical secondary reflector 341 has an inner smaller 341a and contiguous outer larger 341b circular curvature section. The circular curves are constructed the same as in FIG. 1 with a corresponding change in curvature point 94 between them that is in line with a corresponding secondary composite refractor upper side 16 and with a centerline 341aa that starts at the secondary refractor bottom 84. An edge ray 85 is shown entering the refractor 28 and striking the receiver 1. The symmetrical secondary refractor's SBA 64 subtends about 24° and ISBA 74 about 62.5°. The condition of TIR is satisfied if fluid refractor sections 2b and 2d have I-of-R n=1.33, such as for water and solid refractor sections 2ab and 2c have I-of-R n=1.5, such as for glass. The secondary fluid refractor section 2d is about 25% of the transverse area of the secondary composite refractor 2c and 2d.

FIG. 7c is an asymmetrical version of the refractor in FIG. 2b. FIG. 7c has the same secondary composite refractor sections 2c and 2d as FIG. 7b. The effectively continuous secondary reflector 342 has the same shape as in FIG. 7b. The primary refractor's transparent outer solid section 2ac extends to corresponding secondary reflector sections 342b of the secondary reflector 342. The secondary reflector 342 has corresponding sections 342a that are contiguous with the primary fluid refractor section 2b. An edge ray 96 is shown entering the refractor 29 and striking the receiver 1. FIG. 7c has a solid refractor area of about 40% compared to FIG. 7b of about 20%. The refractor embodiment in FIG. 7c can be used to achieve a higher CR than FIG. 7b for a given set of I-of-Rs.

Figure 8:
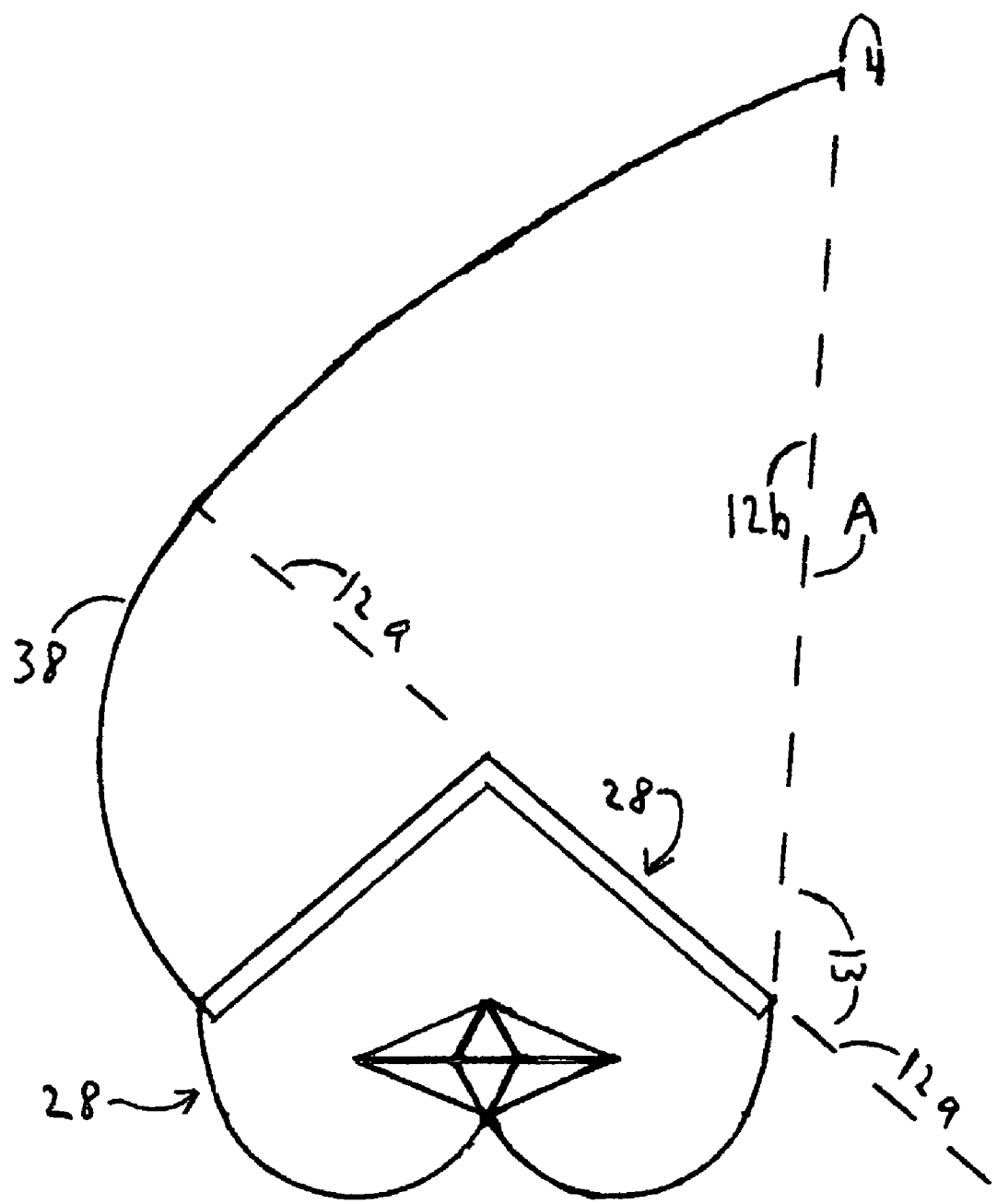
FIG. 8 is a cross-sectional view of an embodiment of the invention.

FIG. 8 is a transverse cross-sectional view of an asymmetrical embodiment of the invention. The refractor 28 is from FIG. 7b, with one adjacent symmetrical half reflector 38 of the reflector from FIG. 6. The transverse AOA 13 is asymmetrically positioned. The AOA's first side 12a is positioned the same as in FIG. 6. The AOA's second side 12b is the line of the aperture A that ends at the reflector edge 4. This embodiment takes advantage of the effectively flat transparent sides of the refractor to accept light over a cross-sectional angle of about 180°. The transverse AOA 13 is the same as in FIG. 5, about 130°, but in FIG. 8, the CR is higher. The CR of FIG. 8 is about the same as in FIG. 6, about three and three quarters, but in FIG. 8, the AOA 13 is larger.

Figure 9:
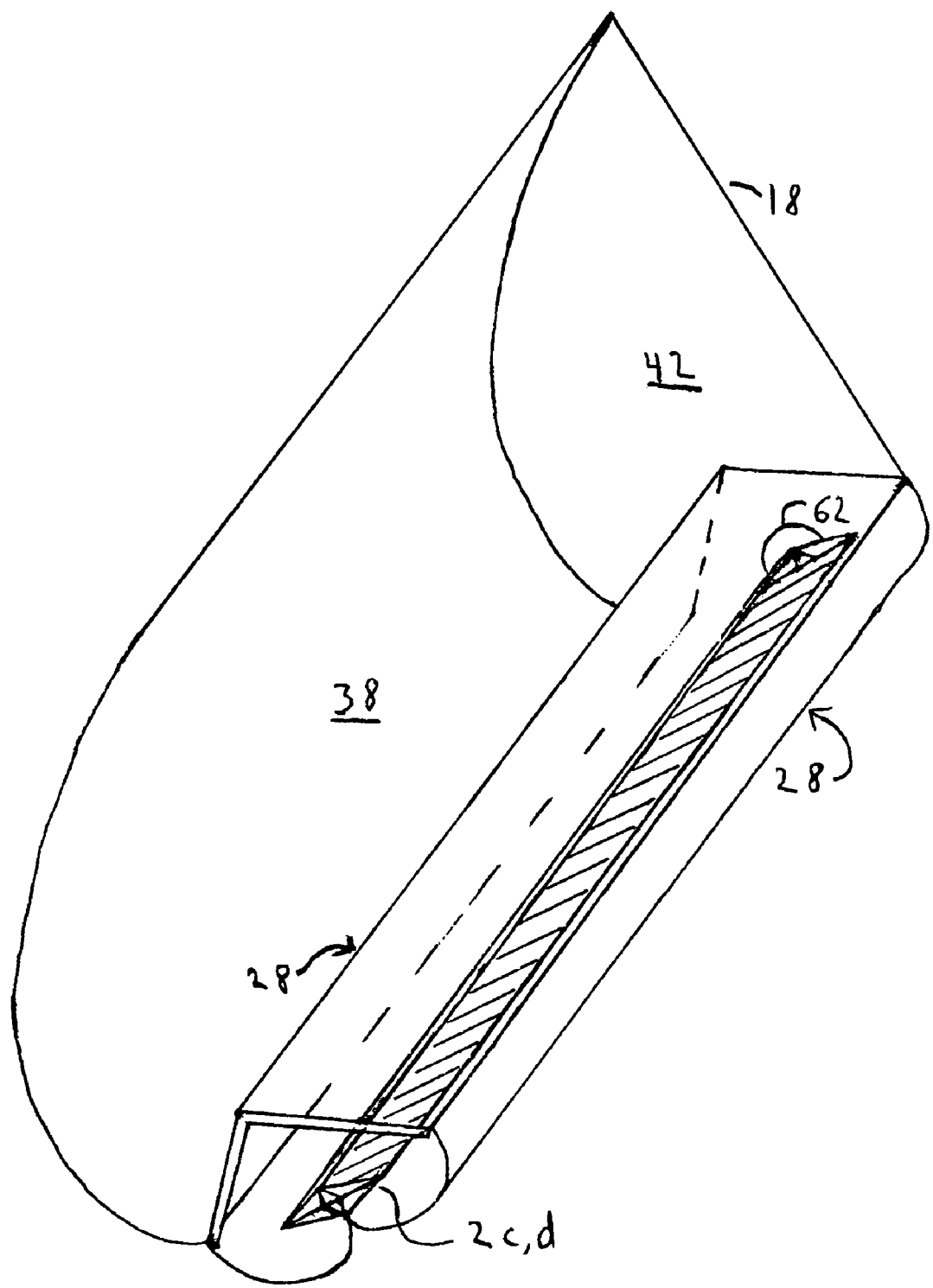
FIG. 9 is a perspective view of FIG. 8.

FIG. 9 is a perspective view of FIG. 8 extended longitudinally in the third dimension. It is shown as a section of trough like collector, with the asymmetrical refractor embodiment 28 of FIG. 7b, and its secondary composite refractor 2c, and 2d. The refractor 28 is adjacent to the asymmetrical reflector 38. The reflector 38 and refractor 28 are terminated with a planar reflector end cap 42 with a free edge 18. The refractor's fluid port 62 exits through the end cap 42. In FIG. 9, the planar reflector end cap 42 is in a transverse cross-section parallel to a transverse cross-section of FIG. 8.

Figure 10:
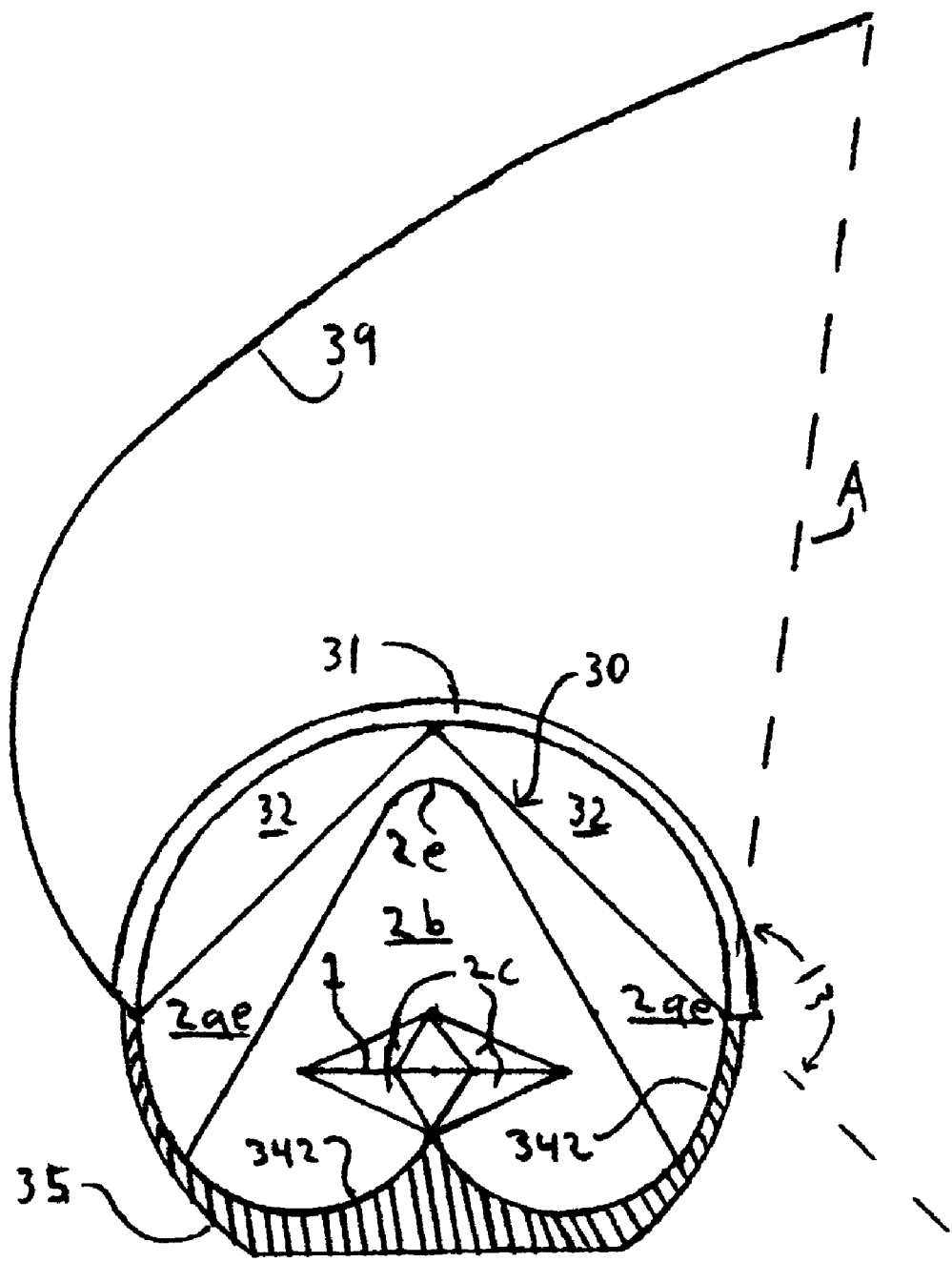
FIG. 10 is a cross-sectional view of an embodiment of the invention.

FIG. 10 is a transverse cross-sectional view of an embodiment of the invention with an asymmetrical reflector 39. FIG. 10 uses a refractor embodiment 30 that is a version of the refractor from FIG. 7c. The aperture A to receiver 1 proportion is a CR of about four. The transverse AOA 13 is about 130°. To improve thermal efficiency a transparent, thin walled, half-round tube 31 surrounds the refractor's transparent outer section 2ae. The gap 32 in between the circular arc section 31 and the transparent solid outer refractor section 2ae, can be filled with a low conductance gas or be substantially evacuated. A an insulating material 35 can enclose the secondary reflector 342. The refractor 30 is proportionally about 40% solid refractor areas 2ae and 2c. The inside top 2e of the solid refractor 2ae is curved to better support a substantially evacuated gap 32.

Figure 11:
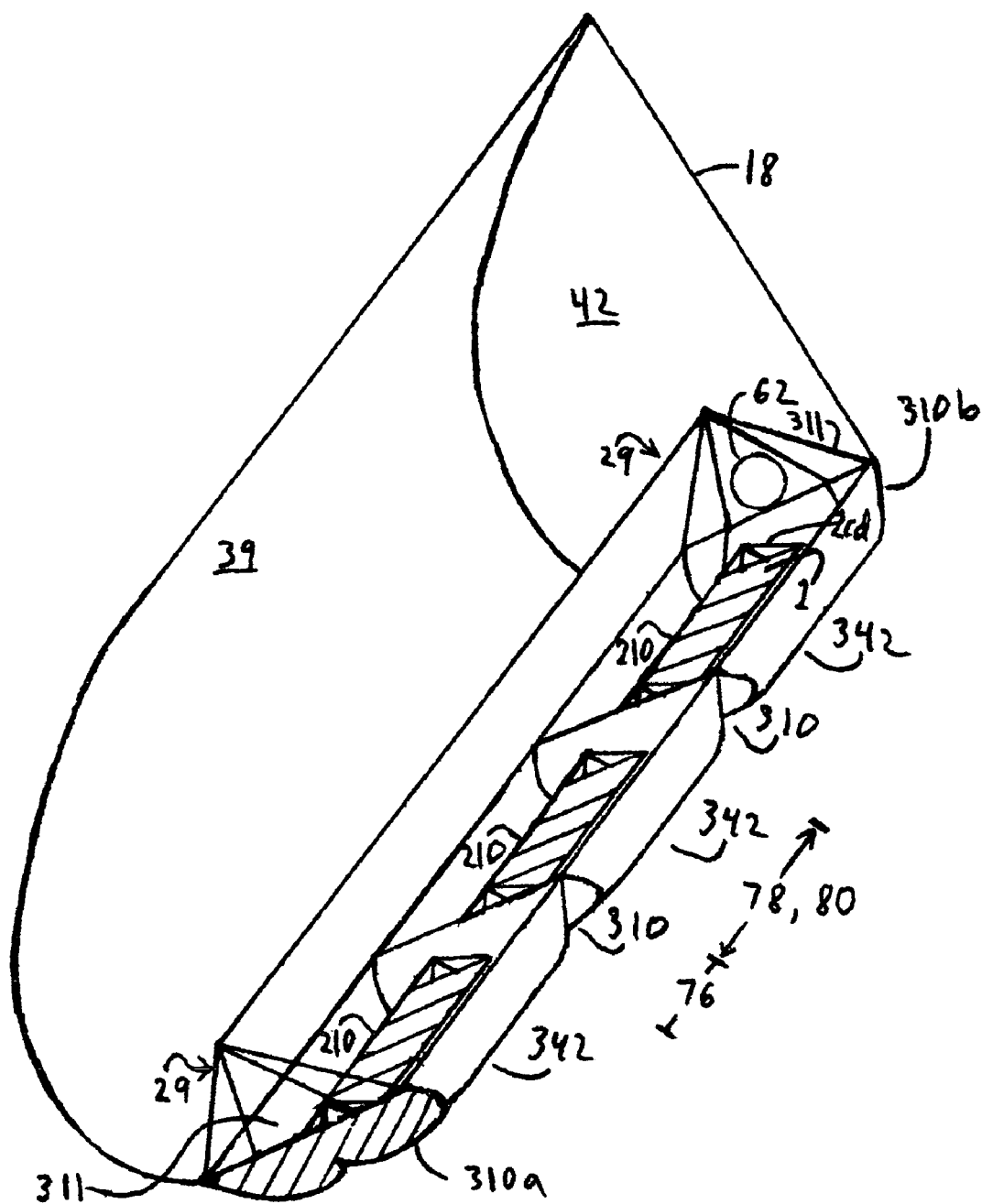
FIG. 11 is a perspective view of an embodiment of the invention.

FIG. 11 is an embodiment of the invention as a higher CR 3-D diffuse light concentrator. FIG. 11 is a perspective view of a simplified FIG. 10, without the circular arc tube section, thermal insulation or solid refractor interior surface curved section. The secondary reflector is partitioned with longitudinally periodic, transversely oriented inverted-V, reflectors 310. The partitions 310 are spaced between secondary reflector compartments 342, both of which are a continuous part of the secondary reflector 342. The inverted-V reflectors 310 face into the refractor 29. The secondary composite refractor and receiver as an equal length combination 2cd and 1, are separated longitudinally, into sections 210. The longitudinal length 76 of the open bottom of each inverted-V reflector section 310 is about half the bottom length 78 of a secondary reflector section 342. The secondary reflector bottom length 78 is about the same length 80 as the secondary refractor-receiver longitudinal section 210, which is parallel to and centered within corresponding secondary reflector bottom lengths 78. The refractor has end caps comprising opposing transparent secondary refractor transverse ends 311 and inward facing halves of corresponding inverted-V reflectors 310a and 310b A reflector 39 planar reflective end cap 42 and its corresponding free edge 18, with a fluid port 62 is shown. FIG. 11 has a CR of about six, a transverse 130° AOA and a longitudinal 180° AOA.

FIG. 12 is two of the transverse cross-sectional view in FIG. 8, lined up to form an array with corresponding adjacent reflectors 38 and refractor-receiver sections 28, tilted up at an angle 15 of about 45° from the horizontal 12a. This allows for a horizontal alignment of the first side 12a of the transverse AOA 13. When tilted to face the plane of the sun this AOA mimics a flat panel collector, assuming little light below the horizon. Arrays can have other configurations and tilt angles.

The collector in FIG. 11 has an AOA of about 130° by 180° with a CR of about 6. The 3-D concentrator in Steigerwald's German patent DE10059455A1 claims an AOA of 80° by 180°, and a CR of only 3.6 with complex optics. Rosenberg's U.S. Pat. No. 7,164,839 has an AOA of 45 by 160° without a stated CR, estimated to be about 3. Patent application #20050081909 of Paull, is a 3-D concentrator and claims a CR of 3 for a double curvature CPC with a combined AOA of only 70.5°. The patent application #20060072222, of Lichy, is a 3-D CPC with a possible refractor CPC secondary and a 70° by 106° AOA without a stated CR, estimated to be 2.5. U.S. Pat. Nos. 6,653,551 and 6,717,045 by Chen, use Fresnel lens with a CPC, and U.S. Pat. No. 7,173,179 by Nicoletti describes a parabolic dish with a fluid filled, PV lined container. These CR-AOA combinations are all significantly lower than that of the current invention. Light guides by Murtha, in U.S. Pat. Nos. 6,021,007 and 6,619,282, have a relatively high geometric CR with a reasonable AOA, but rather low optical and thermal efficiency, with complex, expensive optics. The later version requires large volumes of water with a horizontal placement causing a very significant cosine loss. Even if higher CR optical costs increased modestly, for flat panel equivalent AOA PV collectors, diminishing returns result in light of installed collector system cost. There are other possible embodiments of this invention, in addition to the ones described for illustrative purposes, including additional elements and ancillary components, without departing from the scope of the invention.

The invention claimed is:

1. I claim a radiant energy trap, comprising:, at least one reflector, a refractor and a receiver, the refractor positioned to be incident with radiant energy reflected off the at least one reflector, the receiver positioned to be incident with radiant energy refracted by the refractor, the receiver interfaced with the refractor, the refractor substantially comprises a prism shape, the refractor comprises an outer surface and a transparent interior, the refractor's outer surface comprises at least three longitudinal sides, the at least three longitudinal sides substantially coextensive with the at least one reflector, the at least three longitudinal sides longitudinally parallel to the receiver, the at least three longitudinal sides comprise at least two substantially flat transparent sides, the refractor comprises a transverse cross-section, the refractor's transverse cross-section comprises a perimeter, the at least two substantially flat transparent longitudinal sides comprise a transverse length on the perimeter, the receiver comprises a transverse length, the receiver's transverse length and the at least two substantially flat transparent sides perimeter transverse length comprise a positional and proportional relationship.

2. The radiant energy trap of claim 1 wherein the at least one reflector comprises at least one rate of transverse curvature, the at least one reflector comprises effectively straight longitudinal edges, the refractor's at least three longitudinal sides comprise at least one pair of adjacent longitudinal sides contiguous at a longitudinal bend line along the refractor's outer surface, the refractor's at least two substantially flat transparent longitudinal sides' outer surface each comprise a virtual longitudinal center line, the refractor's outer surface comprises longitudinal symmetry lines, the refractor's outer surface symmetry lines comprise a) longitudinal bend lines and b) virtual longitudinal center lines, wherein at least one of the at least one reflector's effectively straight longitudinal edges is adjacent to at least one of the refractor's outer surface's longitudinal symmetry lines.

3. The radiant energy trap of claim 2, wherein the adjacent at least one reflector in transverse cross-section comprises more than one curvature, wherein each the at least one reflector's more than one curvatures comprises continuous curvatures, the more than one curvature continuous curvatures in transverse cross-section comprise curvature change points.

4. The radiant energy trap of claim 3, wherein in the refractor's transverse cross-section at least one pair of adjacent two substantially flat transparent longitudinal sides of the transverse perimeter comprise the sides of a virtual triangle, the virtual triangle comprises a virtual triangle base, the virtual triangle base and each of the sides of the virtual triangle comprise a corresponding side to base angle of the virtual triangle, the virtual triangle's side to base angle (SBA) comprises a not more than critical angle.

5. The radiant energy trap of claim 4, wherein in transverse cross-section the refractor comprises at least one nested layer, the at least one nested layer each comprise transverse cross-sectional pairs of adjacent transparent sides, the nested layer transverse cross-sectional pairs of adjacent transparent sides comprise the sides of corresponding interior virtual triangles, wherein corresponding interior virtual triangles comprise respective interior virtual triangle bases, the interior virtual triangle bases and their respective sides each comprise an interior side to base angle (ISBA).

6. The radiant energy trap of claim 5, wherein the refractor's transverse cross-section nested layers comprise at least one outer transparent solid layer and at least one transparent inner fluid refractor layer, wherein the transparent inner fluid comprises a thermal transfer medium, wherein the transparent inner fluid refractor section comprises a fluid chamber, having fluid port means for allowing introduction, filling to capacity and through pumping of the thermal transfer fluid through the chamber.

7. The radiant energy trap of claim 6, wherein at least one ISBA comprises a not less than critical angle, wherein at least one pair of the layers of virtual triangle bases comprise co-linearity.

8. The radiant energy trap of claim 7, wherein the receiver comprises opposing faces, the receiver effectively bi-facial, the receiver substantially flat in transverse cross-section, the receiver and the refractor effectively, longitudinally, coextensive, the receiver position and the critical angles comprise a total internal reflection means for the refractor.

9. The radiant energy trap of claim 8, wherein the SBA subtends a critical maximum angle for a given at least one ISBA minimum subtended angle.

10. The radiant energy trap of claim 9, wherein the adjacent at least one reflector in transverse cross-section comprises a symmetrical pair of side by side concave reflectors, wherein the side by side concave reflectors comprise respective side by side effectively straight longitudinal edges, the respective side by side effectively straight longitudinal edges comprise a centerline edge, the centerline edge contiguous with one of the refractor's outer surface longitudinal symmetry lines.

11. The radiant energy trap of claim 10, wherein the refractor's at least three longitudinal sides comprise four substantially flat transparent sides, the refractor's transverse perimeter comprises a diamond shape, the refractor's transverse diamond shaped perimeter comprises a first and second virtual diagonal, the refractor's first virtual diagonal and the virtual triangle base coincident, the refractor's first virtual diagonal and the receiver in transverse cross-section effectively coincident, the side by side reflector centerline edge contiguous with one of the refractor's outer surface longitudinal bend lines, the reflector's centerline edge continuous with a corresponding circular curvature section of the symmetrical pair of side by side concave reflectors, the circular curvature reflector sections each continuous at corresponding curvature change points with respective the reflector's more than one curvature reflector curvature sections.

12. The radiant energy trap of claim 9, wherein the refractor's at least three longitudinal sides comprise an adjacent pair of substantially flat longitudinal transparent sides and at least one transverse curved side, the at least one transverse curved side concave with respect to the interior of the refractor, the at least one transverse concave curved side comprises an overall half round curve, the overall half round curve comprises a transverse virtual line diameter, the overall half round transverse curve comprises at least one concave secondary reflector, the adjacent pair of substantially flat longitudinal transparent sides and the side transverse overall half round curve are contiguous at an opposed pair of the refractor's longitudinal bend lines, the at least one reflector adjacent to at least one of the opposed pair of longitudinal bend lines.

13. The radiant energy trap of claim 12, wherein, the transverse virtual line diameter coincident with the virtual triangle base, the receiver's transverse length centered on, effectively collinear with and effectively half as long as the transverse virtual line diameter, the at least one secondary reflector comprises a symmetrical pair of side by side half round concave reflectors, the symmetrical pair of side by side half round concave reflectors comprise a secondary centerline edge, the secondary centerline edge comprises a transverse secondary edge point, the transverse secondary edge point contiguous with the receiver's transverse length center, wherein one of the at least one reflector and one of the opposed pair of longitudinal bend lines longitudinally adjacent.

14. The radiant energy trap of claim 12, wherein in transverse cross-section, a transparent fluid inner refractor section nests a secondary composite refractor, the secondary composite refractor comprises a solid outer refractor section and secondary fluid inner refractor section, wherein each section of the secondary composite refractor comprises a diamond shape in transverse cross-section, wherein each diamond shape comprises an orthogonal pair of secondary diagonals, the secondary orthogonal diagonals correspondingly collinear, the receivers transverse length collinear with one collinear diagonal set from each orthogonal pair, the receivers transverse length effectively coextensive with a first of two orthogonal diagonals of the secondary composite refractor solid outer refractor section, the receiver effectively parallel to the transverse virtual line diameter of the overall half round concave secondary reflector, and wherein the secondary reflector comprises a symmetrical pair of side by side, circular, two curvatures each, concave reflectors, the symmetrical pair of side by side circular, two curvatures each, concave reflectors comprise a secondary longitudinal centerline edge, the secondary longitudinal centerline edge comprises a transverse secondary edge point, wherein the secondary composite refractor solid outer refractor section's second diagonal comprises a first and second end point, the first end point contiguous with the transverse secondary edge point, the second end point coincident with the virtual line diameter of the at least one concave secondary reflector, and wherein the receiver's transverse length less than half the length of the secondary reflector's virtual line diameter, the secondary composite refractor solid outer refractor transverse diamond shape ISBA comprising a secondary not more than SBA, wherein one effectively straight longitudinal edge of one of the at least one reflector, adjacent to one of the opposed pair of longitudinal bend lines.

15. The radiant energy trap of claim 14, wherein the secondary reflector comprises longitudinal partitions, the partitions comprise transverse pairs of opposed "inverted-V" reflector sections, the partitions spaced between secondary reflector compartments, the secondary reflector partitions and compartments sequentially continuous, the closed end of the "inverted-V" a transverse line segment, the transverse line segment coincident with the secondary reflector's virtual line diameter, the open end of the "inverted-V" comprises a longitudinal line segment, the "inverted-V" longitudinal line segment collinear with a secondary reflector virtual bottom line, the secondary reflector virtual bottom line, in transverse cross-section, comprises a virtual tangent line to both of the side by side circular concave paired secondary reflector sections, the secondary reflector virtual bottom line comprises a compartment bottom longitudinal line length, the secondary composite refractor and the coextensive receiver comprise refractor-receiver longitudinal sections, the refractor-receiver longitudinal sections nested within respective secondary reflector compartments.

16. The radiant energy trap of claim 15, wherein the refractor-receiver sections each comprise a longitudinal length, the secondary reflector compartment bottom longitudinal line length and the refractor-receiver longitudinal length coextensive, the secondary reflector compartment bottom longitudinal line length and the "inverted-V" longitudinal line segment comprise a proportional relationship.

17. The radiant energy trap of claim 16 wherein the refractor's transparent solid outer section comprises a SBA=45°, the ISBA=62.9°, the secondary SBA=24° and the secondary ISBA=62.5°, the solid refractor sections nominal index of refraction n=1.5 and the fluid refractor sections n=1.33, the ISBA's interior sides extended linearly to the secondary reflector, the refractor's transverse cross-section comprises about a 40% solid area, the secondary reflector compartment bottom longitudinal line length and the "inverted-V" longitudinal line segment length comprise a two to one ratio, the refractor comprises a pair of adjacent longitudinal bend lines non-contiguous with the reflector, the pair of, non-contiguous with the reflector, adjacent bend lines, in transverse cross-section comprise a pair of adjacent bend points, the pair of adjacent bend points comprise a virtual tangent line, the adjacent bend points virtual tangent line intersects a curvature change point, and wherein the reflector comprises two continuous transverse curvature sections, the two continuous transverse curvature sections continuous at the curvature change point tangent line intersect, the curvature section adjacent to the refractor comprises a circular curvature, the circular curvature continuous with a parabolic curvature section.

18. The radiant energy trap of claim 17, wherein the refractor's opposing transverse ends comprise corresponding end caps, wherein each end cap comprises a transparent section for the transparent sides transverse end and reflective section half of the "inverted-V" secondary reflector, the reflector comprises opposing reflective end caps.

19. The radiant energy trap of claim 18, wherein the refractor's transparent solid sections comprise transparent materials such as glass or acrylic, the refractor's fluid sections comprise transparent mediums such as water, or freeze protected transparent fluid.

20. The radiant energy trap of claim 19, wherein the reflective surfaces comprise materials such as protected front-silvered or aluminized opaque sheet or rear-silvered or aluminized, acrylic or sun rated transparent plastic sheet.

21. The radiant energy trap of claim 20 comprises any of the following as a combination; a) transparent tube or tube arc section enclosing the refractor's transparent outer surface and or thermal insulation for non-transparent surfaces, b) arrayed configurations c) transparent cover plate and or frame d) thermal transfer fluid transport structures e) thermal transfer fluid pump, f) thermal transfer fluid storage tank, g) heat exchanger, h) heat pump, i) DC to AC inverter, j) thermal to electric converter.

22. The radiant energy trap of claim 21, wherein, the receiver comprises at least one bi-facial PV cell, wherein said end caps have sealable holes sized for electrical connections for the at least one bi-facial PV cell.

23. The radiant energy trap of claim 22, wherein the reflector and the refractor's transparent sides effectively comprise an aperture means for radiant energy trapped, the adjacent bend points' virtual tangent line effectively comprises a virtual side of the aperture, wherein at least one virtual side of the aperture comprises a virtual local horizon line, the virtual local horizon line parallel with a local horizon on the surface of the earth, substantially in the direction of the plane of the sun.

* * * * *